US008643081B2

(12) United States Patent
Fujiwara et al.

(10) Patent No.: US 8,643,081 B2
(45) Date of Patent: Feb. 4, 2014

(54) SEMICONDUCTOR MEMORY DEVICE

(75) Inventors: Tomoko Fujiwara, Odawara (JP);
Yoshiaki Fukuzumi, Yokohama (JP);
Hideaki Aochi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/603,797

(22) Filed: Sep. 5, 2012

(65) Prior Publication Data

US 2013/0234233 A1 Sep. 12, 2013

(30) Foreign Application Priority Data

Mar. 7, 2012 (JP) .................................. 2012-050403

(51) Int. Cl.
*H01L 29/788* (2006.01)
(52) U.S. Cl.
USPC .................... 257/321; 438/266; 257/E27.104
(58) Field of Classification Search
USPC .......... 257/315, 321, 326, E27.104, E21.662; 438/266
See application file for complete search history.

(56) References Cited

U.S. PATENT DOCUMENTS

| 7,675,107 | B2* | 3/2010 | Nansei .......................... 257/321 |
| 8,148,769 | B2 | 4/2012 | Kito et al. |
| 2009/0146190 | A1 | 6/2009 | Fukuzumi et al. |
| 2010/0072538 | A1 | 3/2010 | Kito et al. |
| 2010/0207195 | A1 | 8/2010 | Fukuzumi et al. |

FOREIGN PATENT DOCUMENTS

| JP | 2009-111049 | 5/2009 |
| JP | 2011-249559 | 12/2011 |

* cited by examiner

*Primary Examiner* — Quoc Hoang
(74) *Attorney, Agent, or Firm* — Oblon, Spivak, McClelland, Maier & Neustadt, L.L.P.

(57) ABSTRACT

According to one embodiment, a semiconductor memory device comprises a first layer, a first conductive layer, a insulating layer, and a second conductive layer stacked on a substrate, a block insulating layer on inner surfaces of a pair of through-holes formed in the first conductive layer, the insulating layer, and the second conductive layer, and on an inner surface of a connecting hole connecting lower ends of the pair of through-holes, a charge storage layer on the block insulating layer, a second layer on the charge storage layer, and a semiconductor layer on the second layer. The second layer includes an air gap layer on the charge storage layer in the pair of through-holes, and a third conductive layer on the charge storage layer in the connecting hole.

20 Claims, 13 Drawing Sheets

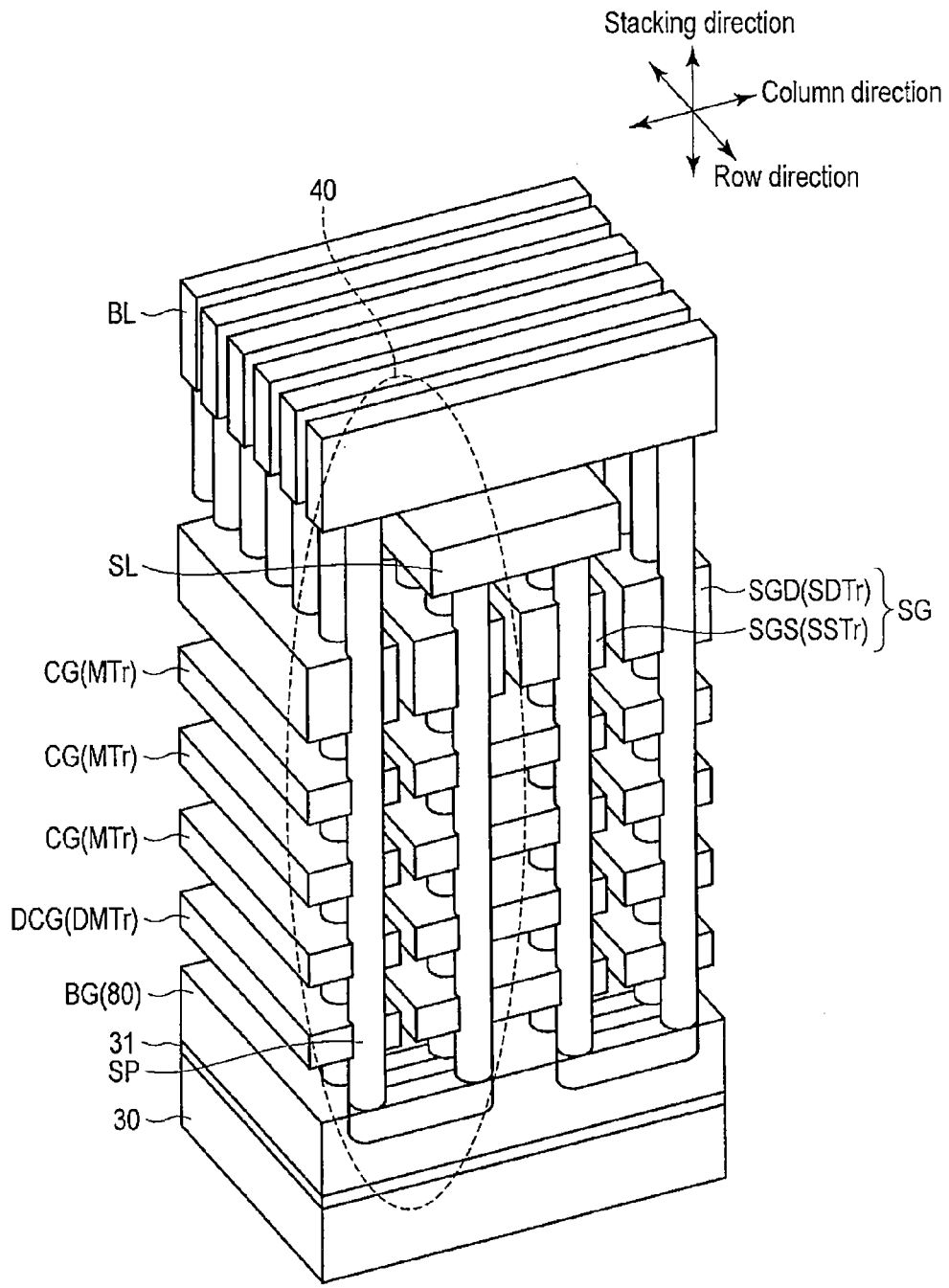
F I G. 2

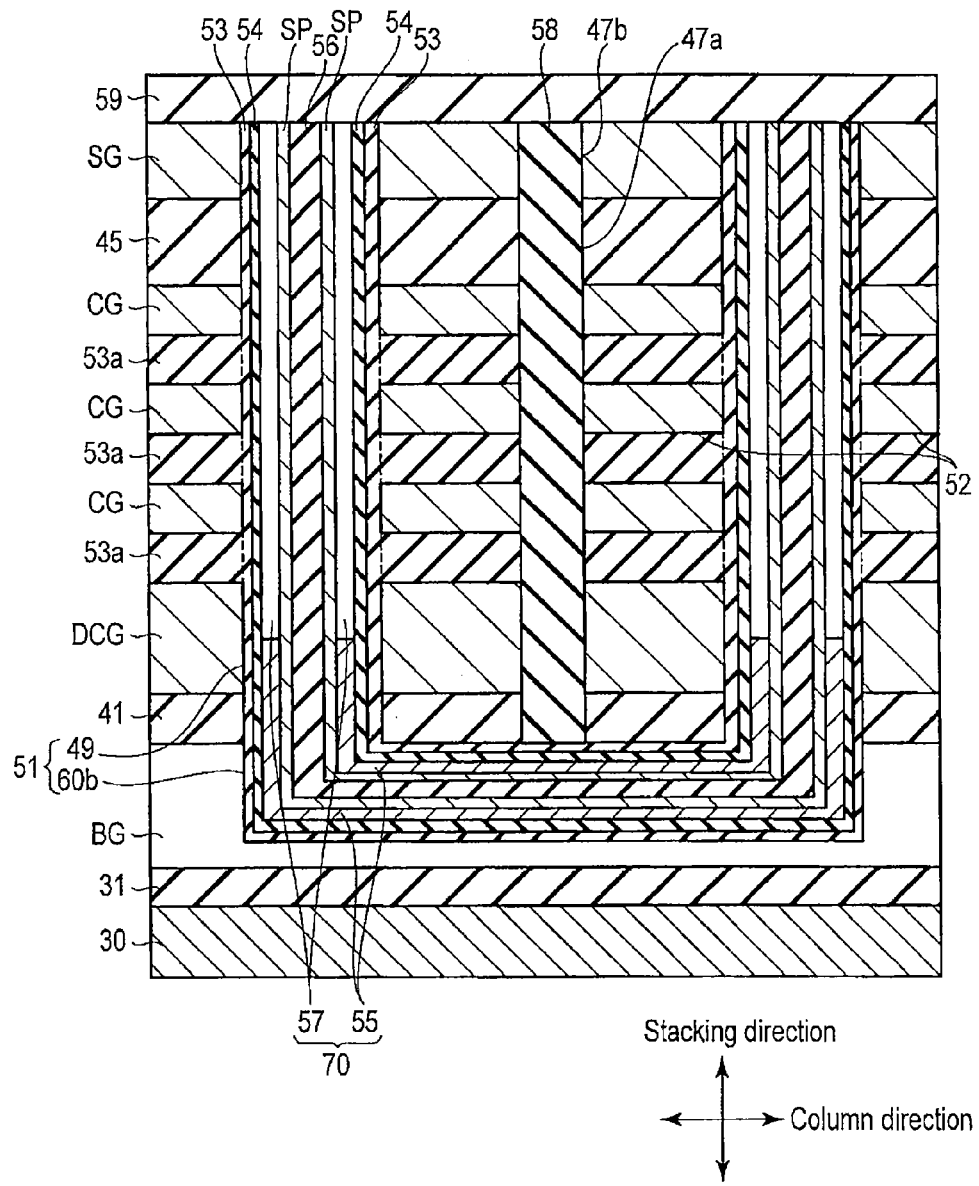
F I G. 3

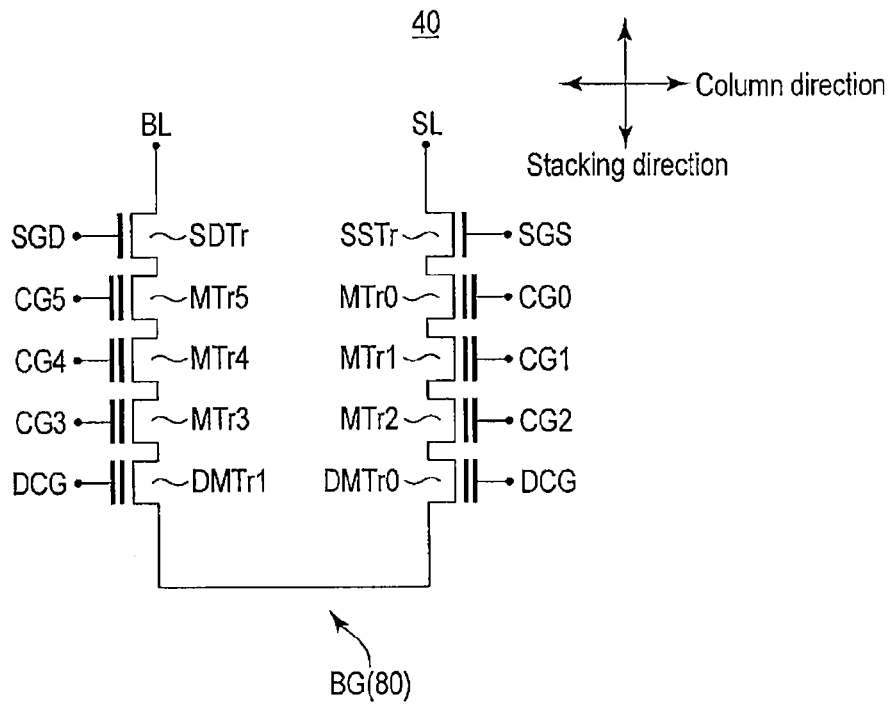
F I G. 4
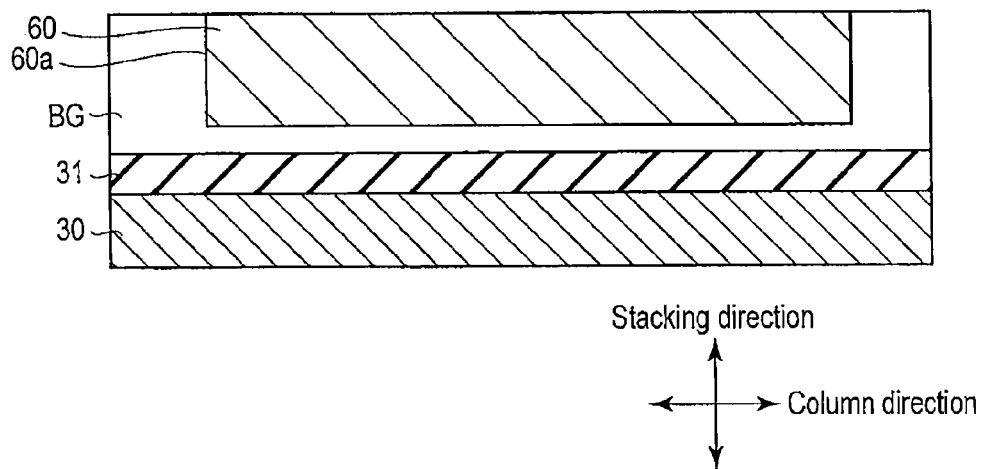
F I G. 5

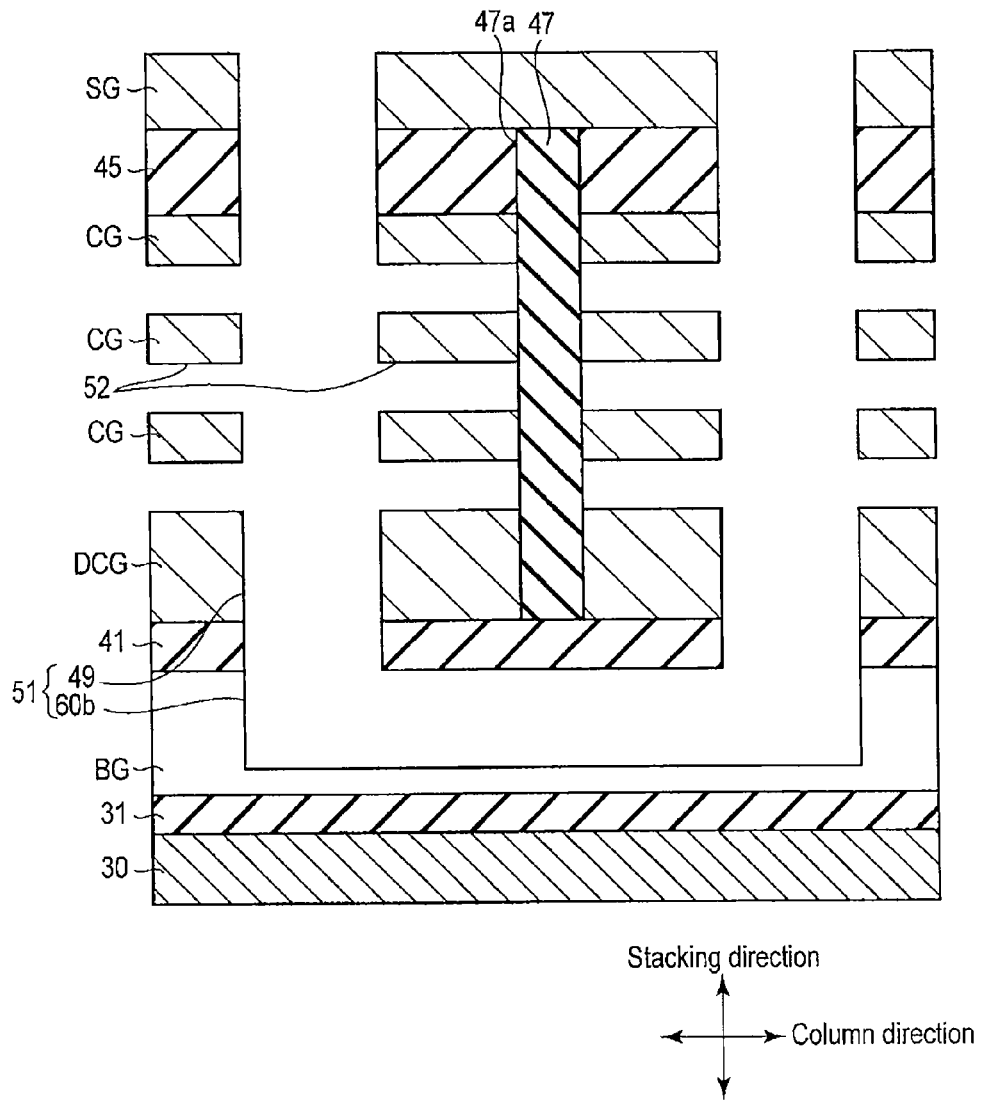
F I G. 9

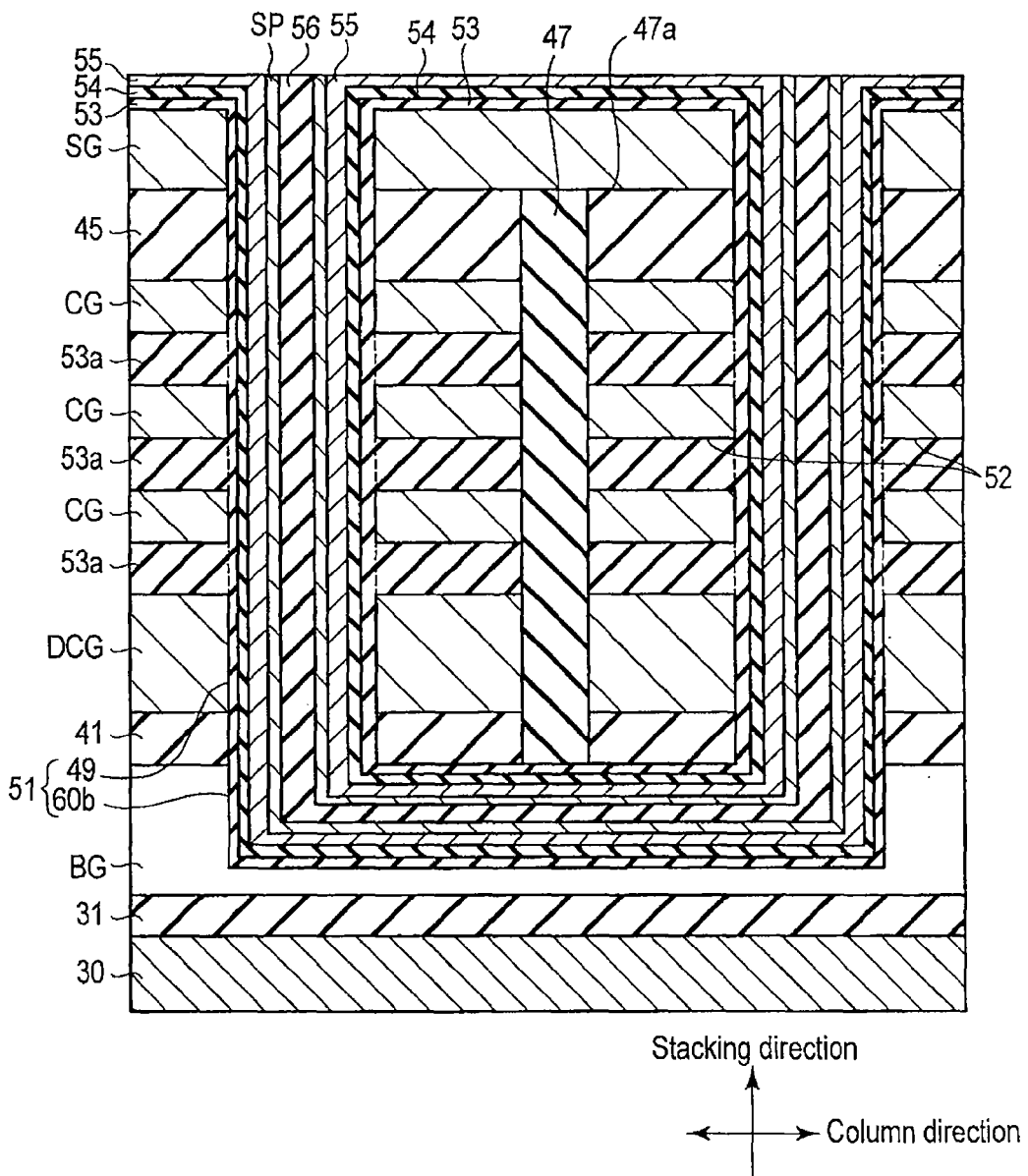
F I G. 13

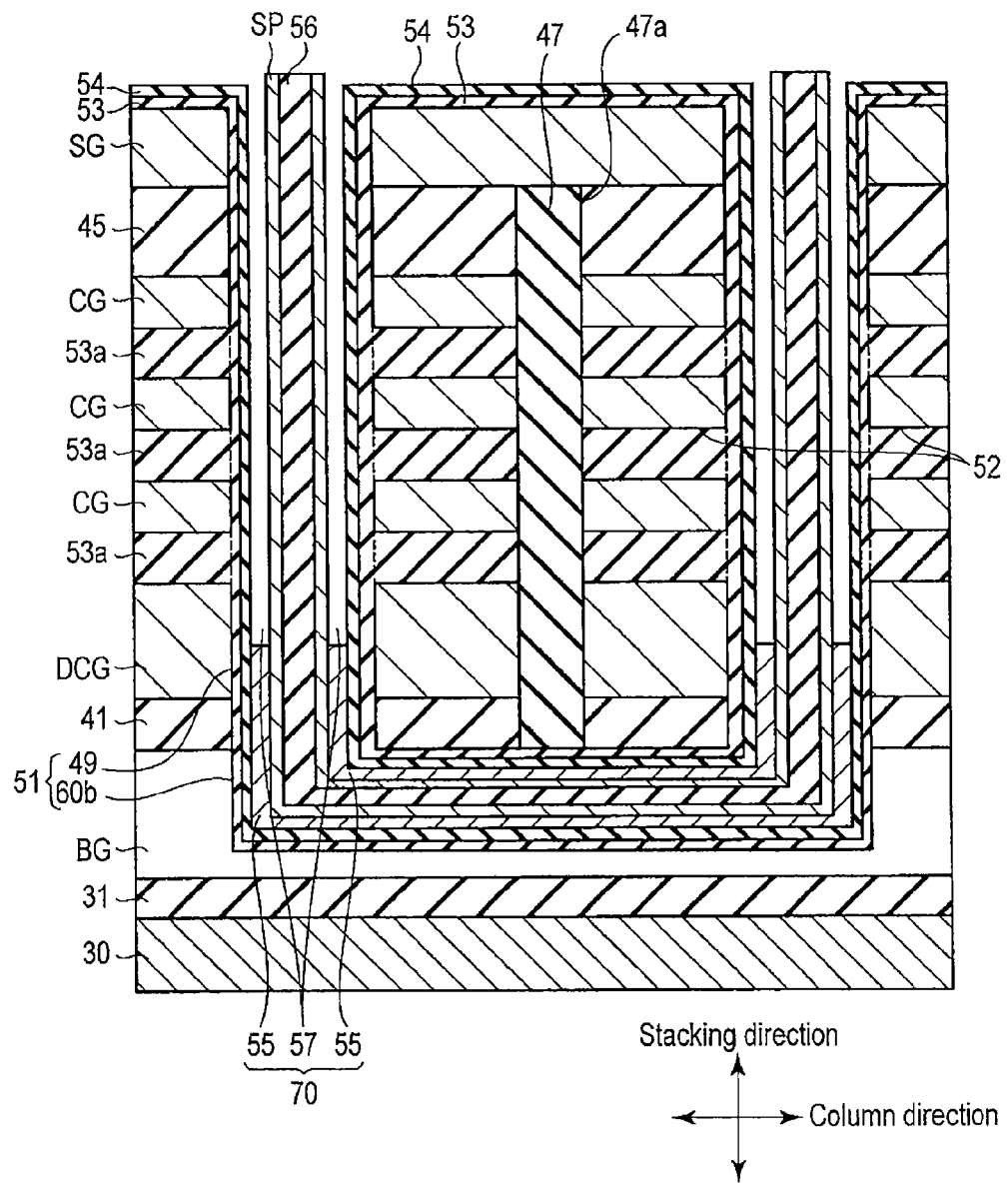
F I G. 14

SEMICONDUCTOR MEMORY DEVICE

CROSS-REFERENCE TO RELATED APPLICATIONS

This application is based upon and claims the benefit of priority from Japanese Patent Application No. 2012-050403, filed Mar. 7, 2012, the entire contents of which are incorporated herein by reference.

FIELD

Embodiments described herein relate generally to a semiconductor memory device.

BACKGROUND

As a NAND flash memory, a three-dimensionally stacked memory formed by batch processing and stacking layers in the vertical direction has been proposed in order to suppress the increase in process cost.

In this three-dimensionally stacked memory, a cylindrical hole (memory hole) is formed at once through a plurality of electrodes stacked on a semiconductor substrate, and a memory film is formed on the inner wall of the hole. After that, polysilicon (a silicon pillar) functioning as a channel is formed inside the hole. This makes it possible to form a NAND string (memory string) including a plurality of MONOS memory cells connected in series in the stacking direction at once.

Furthermore, as the three-dimensionally stacked memory described above, a memory in which a U-shaped silicon pillar including a pair of pillar portions and a connecting portion connecting the lower ends of the pillar portions is used as a channel has been proposed. In this memory, a memory string is formed along the U-shaped silicon pillar.

BRIEF DESCRIPTION OF THE DRAWINGS

FIG. 2 is a perspective view showing a NAND string according to the embodiment;

FIG. 3 is an enlarged sectional view of the NAND string shown in FIG. 2;

FIG. 4 is a circuit diagram showing the NAND string shown in FIG. 3; and

FIGS. 5, 6, 7, 8, 9, 10, 11, 12, 13, and 14 are sectional views showing manufacturing steps of the NAND string according to the embodiment.

DETAILED DESCRIPTION

Figure 1:
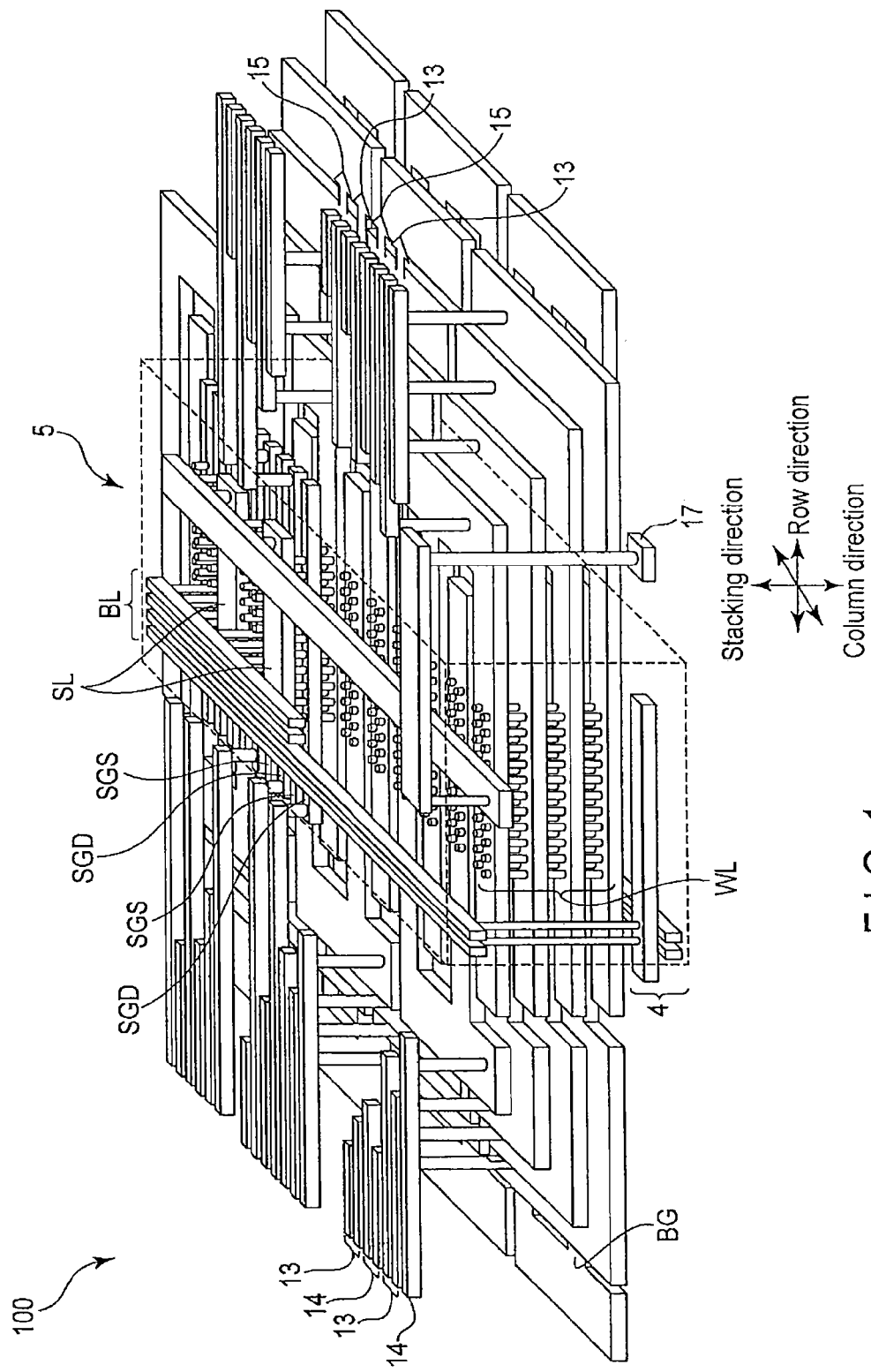
FIG. 1 is a perspective view showing an overall configuration example of a semiconductor memory device according to an embodiment.

In general, according to one embodiment, a semiconductor memory device comprises a semiconductor substrate, a first layer formed on the semiconductor substrate, a first conductive layer, inter-electrode insulating layer, and second conductive layer sequentially stacked on the first layer, a block insulating layer formed on the inner surfaces of a pair of through-holes formed in the first conductive layer, inter-electrode insulating layer, and second conductive layer and extending in the stacking direction, and on the inner surface of a connecting hole formed in the first layer and connecting the lower ends of the pair of through-holes, a charge storage layer formed on the block insulating layer, a second layer formed on the charge storage layer, and a semiconductor layer formed on the second layer. The second layer includes an air gap layer on the charge storage layer in the pair of through-holes formed in the second conductive layer, and a third conductive layer on the charge storage layer in the connecting hole formed in the first layer.

A three-dimensionally stacked memory (U-shaped [pipe-shaped], three-dimensionally stacked memory) using a U-shaped silicon pillar poses the following problems.

The first problem is the variation in cell characteristics. Of a plurality of stacked control gates, the structures on the two sides (upper and lower sides) of the lowermost control gate positioned on a back-gate are different from those of other control gates. Therefore, the lowermost control gate cannot have good characteristics, and this produces variations as a whole. In contrast, when using the lowermost control gate as a dummy gate, other control gates to be actually used as cells can have the same structure. This makes it possible to reduce the variation in cell characteristics.

The second problem is leakage from the charge storage layer. When scaling a three-dimensionally stacked memory, the cell size must be reduced, and this makes it necessary to decrease the memory hole diameter and decrease the film thickness of a MONOS film deposited inside the memory hole. If a tunnel layer of the MONOS film is thinned, leakage from the charge storage layer increases, and the charge retention characteristic deteriorates. In contrast, when using the air gap layer as the tunnel layer, it is possible to suppress the leakage from the charge storage layer, and improve the charge retention characteristic.

When forming the air gap layer as the tunnel layer in the U-shaped three-dimensionally stacked memory, however, a U-shaped silicon pillar and core layer formed inside the tunnel layer are hollowed (in midair). Since the U-shaped silicon pillar and core layer cannot be supported, the air gap layer cannot simply be used as the tunnel layer.

This embodiment solves the above-mentioned first and second problems of the U-shaped three-dimensionally stacked memory by using the lowermost control gate as a dummy gate, and filling a sacrificial layer of a metal layer in the lower portion of the tunnel layer.

This embodiment will be explained below with reference to the accompanying drawing. In this drawing, the same reference numerals denote the same parts. Also, a repetitive explanation will be made as needed.

<Embodiment>

A semiconductor memory device according to this embodiment will be explained below with reference to FIGS. 1, 2, 3, 4, 5, 6, 7, 8, 9, 10, 11, 12, 13, and 14. In this embodiment, a third sacrificial layer 55 is filled in the lower portion of a tunnel layer 70 in a U-shaped memory hole 51. Accordingly, a U-shaped silicon pillar SP and core layer 56 can be supported by the third sacrificial layer 55. Also, a lowermost control gate CG is used as a dummy control gate DCG, and the third sacrificial layer 55 is formed in the U-shaped memory hole 51 from a back-gate BG to the dummy control gate DCG. This makes it possible to increase the margin of the formation region of the third sacrificial layer 55. Furthermore, when forming the third sacrificial layer 55 by a metal layer, controlling back-gate BG and a control circuit for the control are unnecessary. Consequently, operation control and the circuit layout can be relaxed. The semiconductor memory device according to this embodiment will be explained in detail below.

[Overall Configuration Example]

First, an overall configuration example of the semiconductor memory device according to this embodiment will be explained with reference to FIG. 1.

FIG. 1 is a perspective view showing the overall configuration example of the semiconductor memory device according to this embodiment.

As shown in FIG. 1, a memory cell array 5 includes a plurality of word lines WL (control gates CG), a plurality of bit lines BL, a plurality of source lines SL, a plurality of back-gates BG, a plurality of source-side selection gates SGS, and a plurality of drain-side selection gates SGD.

In the memory cell array 5, memory cell transistors MTr for storing data are arranged at the intersections of the plurality of stacked word lines WL and a U-shaped silicon pillar SP (to be described later). The plurality of memory cell transistors MTr whose current paths are connected in series along the U-shaped silicon pillar SP form a NAND string 40. A plurality of NAND strings 40 are arranged in a matrix. Various structures of the NAND string 40 in the memory cell array 5 will be described later with reference to FIGS. 2 and 3.

The end portions of the plurality of stacked word lines WL in the row direction have a stepwise shape, and a contact is connected to the upper surface of each step. The upper portions of these contacts are connected to interconnections. That is, each word line WL is connected to a word line driver 13 via the contact and interconnection. The word line driver 13 controls a voltage to be applied to the word line WL.

In the column direction, even-numbered word lines WL are connected to each other in one end in the row direction, and odd-numbered word lines WL are connected to each other in the other end in the row direction. Note that FIG. 1 shows an example in which four layers of the word lines WL are stacked, but the present embodiment is not limited to this.

Contacts are connected to the upper surfaces of the end portions of the source lines SL in the row direction, and interconnections are connected to the upper portions of these contacts. The source lines SL are connected to a source line driver 17 via these contacts and interconnections. The source line driver 17 controls a voltage to be applied to the source line SL. Note that one source line driver 17 is connected to, for example, a plurality of source lines SL.

Contacts are connected to the upper surfaces of the end portions of the source-side selection gates SGS in the row direction, and interconnections are connected to the upper portions of these contacts. The source-side selection gates SGS are connected to a source-side selection gate driver 14 via these contacts and interconnections. The source-side selection gate driver 14 controls a voltage to be applied to the source-side selection gate SGS.

Contacts are connected to the upper surfaces of the end portions of the drain-side selection gates SGD in the row direction, and interconnections are connected to the upper portions of these contacts. The drain-side selection gates SGD are connected to a drain-side selection gate driver 15 via these contacts and interconnections. The drain-side selection gate driver 15 controls a voltage to be applied to the drain-side selection gate SGD.

Contacts are connected to the lower surfaces of the end portions of the bit lines BL in the column direction, and a sense amplifier 4 is connected to the lower portions of these contacts. The sense amplifier 4 controls a voltage to be applied to the bit line BL.

In this embodiment, control of the back-gate BG is unnecessary. Therefore, there is no back-gate controller for controlling the back-gate BG. Note that the back-gate BG has no transistor function in this embodiment, but this component will be explained as the back-gate BG in this specification. The back-gate BG will be described in detail later.

Note also that all interconnections connected to various drivers are formed in interconnection layers on the same level in FIG. 1, but the present embodiment is not limited to this, and these interconnections may also be formed in interconnection layers on different levels. Furthermore, although the number of drivers is determined in accordance with the number of gates, one driver can be connected to one gate or a predetermined number of gates.

[Configuration Example of NAND String]

A configuration example of the NAND string 40 according to this embodiment will be explained below with reference to FIGS. 2, 3, and 4.

FIG. 2 is a perspective view showing the NAND string 40 according to this embodiment. FIG. 3 is an enlarged sectional view of the NAND string 40 shown in FIG. 2, and shows the sectional structure along the column direction of the NAND string 40 in more detail. Note that a memory film is omitted in FIG. 2, and the source lines SL and bit lines BL are omitted in FIG. 3.

In the memory cell array 5 as shown in FIGS. 2 and 3, the NAND string 40 is formed on a semiconductor substrate 30, and includes the back-gate BG, the dummy control gate DCG, the plurality of control gates CG, a selection gate SG, the U-shaped silicon pillar (semiconductor layer) SP, and a memory film (a block insulating layer 53, charge storage layer 54, and tunnel insulating layer 70).

Note that the block insulating layer 53, charge storage layer 54, and tunnel insulating layer 70 will collectively be referred to as a memory film in this specification, but the memory film is not limited to a film for storing data.

The back-gate BG is formed on an insulating layer 31 on the semiconductor substrate 30. The back-gate BG is formed to two-dimensionally spread. The back-gate BG can be a conductive layer of, for example, polysilicon in which an impurity (for example, phosphorus) is doped, and can also be an insulating layer of, for example, silicon oxide, silicon nitride, or a high-k material. Although details will be described later, the back-gate BG of this embodiment does not form a transistor together with the U-shaped silicon pillar SP, but includes the third sacrificial layer 55, thereby forming an interconnection 80. Therefore, the portion of the back-gate BG is always in a conductive state.

The dummy control gate DCG is formed on an insulating layer 41 on the back-gate BG. The dummy control gate DCG consists of a doped silicon layer in which an impurity (for example, boron) is doped.

The plurality of control gates CG are formed with inter-electrode insulating layers 53a being formed between them on the dummy control gate DCG. In other words, the plurality of inter-electrode insulating layers 53a and the plurality of control gates CG are alternately stacked on the dummy control gate DCG. The control gate CG consists of a conductive layer and has a structure similar to those of the dummy control gate DCG. That is, the dummy control gate DCG is the control gate CG positioned in the lowermost layer among the plurality of control gates CG. The dummy control gate DCG is desirably formed to have a film thickness larger than that of the control gate CG formed on the dummy control gate DCG.

The selection gate SG is formed on an insulating layer 45 on the uppermost control gate CG. The selection gate SG consists of, for example, a doped silicon layer in which an impurity is doped, similar to the control gate CG and dummy control gate DCG.

The source line SL is formed on an insulating layer 59 on the selection gate SG, and the bit line BL is formed on an insulating layer (not shown) on the source line SL.

The U-shaped memory hole 51 is formed in the selection gate SG, control gates CG, dummy control gate DCG, back-gate BG, insulating layers 41 and 45, and inter-electrode insulating layers 53a. The U-shaped memory hole 51 includes a pair of through-holes 49 juxtaposed in the column direction, and a connecting hole 60b connecting the lower ends of the pair of through-holes 49. The through-holes 49 are formed to extend in the stacking direction in the selection gate SG, control gates CG, dummy control gate DCG, insulating layers 41 and 45, and inter-electrode insulating layers 53a. The connecting hole 60b is formed to extend in the column direction in the back-gate BG.

In addition, in the control gates CG, dummy control gate DCG, insulating layers 41 and 45, and inter-electrode insulating layers 53a, a slit 47a is formed to spread in the row direction and stacking direction between the pair of through-holes 49. This divides the control gates CG, dummy control gate DCG, insulating layers 41 and 45, and inter-electrode insulating layers 53a in the row direction. Furthermore, an opening 47b is formed in the selection gate SG to spread in the row direction and stacking direction in the upper portion of the slit 47a so that the slit 47a opens. This divides the selection gate SG along the row direction: one functions as the drain-side selection gate SGD, and the other functions as the source-side selection gate SGS. An insulating material 58 is buried in the slit 47a and opening 47b.

The memory film includes the block insulating layer 53, charge storage layer 54, and tunnel layer 70.

The block insulating layer 53 is formed on the inner surface of the U-shaped memory hole 51. That is, the block insulating layer 53 is formed on the selection gate SG, control gates CG, dummy control gates DCG, back-gate BG, inter-electrode insulating layers 53a, and insulating layers 41 and 45 in the U-shaped memory hole 51. The block insulating layer 53 is an insulating layer of, for example, silicon oxide or silicon nitride, or has a multilayered structure including layers of silicon oxide and silicon nitride.

The block insulating layer 53 may also be integrated with the inter-electrode insulating layers 53a. That is, the inter-electrode insulating layers 53a may also have a structure in which the block insulating layer 53 is buried in a gap 52 between two control gates CG adjacent to each other in the stacking direction (and between the control gate CG and dummy control gate DCG).

The charge storage layer 54 is formed on the block insulating layer 53 in the U-shaped memory hole 51. The charge storage layer 54 is an insulating layer of, for example, silicon nitride.

The tunnel layer 70 is formed on the charge storage layer 54 in the U-shaped memory hole 51. The tunnel layer 70 of this embodiment will be described in detail later.

The U-shaped silicon pillar SP is formed on the tunnel layer 70 in the U-shaped memory hole 51. That is, the U-shaped silicon pillar SP includes a pair of pillar portions formed on the memory film in the pair of through-holes 49, and a connecting portion formed on the memory film in the connecting hole 60b. The U-shaped silicon pillar SP is formed by a conductive layer of, for example, polysilicon containing an impurity (for example, phosphorus), and functions as a channel.

The core layer 56 is formed on the U-shaped silicon pillar SP in the U-shaped memory hole 51. The core layer 56 is an insulating layer of, for example, silicon oxide, and fills the U-shaped memory hole 51. Note that the core layer 56 may also be a hollow, i.e., the U-shaped memory hole 51 need not be filled.

Although not shown, it is also possible to silicidize those portions of the selection gate SG, control gate CG, and dummy control gate DCG, which are in contact with the insulating material 58.

The U-shaped silicon pillar SP and the memory film and various gates formed around the U-shaped silicon pillar SP form various transistors. The NAND string 40 is formed along the U-shaped silicon pillar SP functioning as a channel.

More specifically, the control gate CG, the U-shaped silicon pillar SP, and the memory film formed between them form the memory cell transistor MTr. Also, the selection gates SG (the drain-side selection gate SGD and source-side selection gate SGS), the U-shaped silicon pillar SP, and the memory film formed between them form selection transistors (a drain-side selection transistor SDTr and source-side selection transistor SSTr). Furthermore, the dummy control gate DCG, the U-shaped silicon pillar SP, and the memory film formed between them form a dummy memory cell transistor DMTr.

Note that in the selection transistor and dummy memory cell transistor DMTr, the memory film does not store data but simply functions as a gate insulating film. In particular, the dummy memory cell transistor DMTr operates as follows.

In a write operation, a write pass voltage is applied to the dummy control gate DCG in the same manner as that for the control gate CG connected to the memory cell transistor MTr as a non-write target, and no data is written in the dummy memory cell transistor DMTr. In a read operation, a voltage that turns on the dummy memory cell transistor DMTr is applied to the dummy control gate DCG.

In this embodiment, the back-gate BG, the U-shaped silicon pillar SP, and the memory film formed between them do not form a so-called back-gate transistor. This is so because, as will be described later, the memory film includes the third sacrificial layer 55 (a metal layer) in contact with the U-shaped silicon pillar SP in the back-gate BG. Accordingly, the back-gate BG, the U-shaped silicon pillar SP, and the memory film formed between them form the interconnection 80 that is always in a conductive state.

FIG. 4 is a circuit diagram showing the NAND string 40 shown in FIGS. 2 and 3.

As shown in FIG. 4, the NAND string 40 includes the source-side selection transistor SSTr, the drain-side selection transistor SDTr, memory cell transistors MTr0 to MTr5, and dummy memory cell transistors DMTr0 and DMTr1.

The current paths of memory cell transistors MTr0 to MTr5 and dummy memory cell transistors DMTr0 and DMTr1 are connected in series between the source-side selection transistor SSTr and drain-side selection transistor SDTr. The interconnection 80 is formed between dummy memory cell transistors DMTr0 and DMTr1. The interconnection 80 is formed in the back-gate BG.

More specifically, the current paths of memory cell transistors MTr0 to MTr2 and dummy memory cell transistor DMTr0 are connected in series in the stacking direction. Also, the current paths of dummy memory cell transistor DMTr1 and memory cell transistors MTr3 to MTr5 are connected in series in the stacking direction. These current paths are connected in series by forming the interconnection BO between dummy memory cell transistors DMTr0 and DMTr1 in the lower portion in the stacking direction. That is, the current paths of the source-side selection transistor SSTr, drain-side selection transistor SDTr, memory cell transistors MTr0 to MTr5, and dummy memory cell transistors DMTr0 and DMTr1 are connected in series as the NAND string 40 along the U-shaped silicon pillar SP shown in FIG. 2.

The control gates of memory cell transistors MTr0 to MTr5 are respectively connected to control gates CG0 to CG5, and the control gates of dummy memory cell transistors DMTr0 and DMTr1 are respectively connected to dummy control gates DCG0 and DCG1. The gate of the source-side selection transistor SSTr is connected to the source-side selection gate SGS, and the gate of the drain-side selection transistor SDTr is connected to the drain-side selection gate SGD.

The tunnel layer 70 according to this embodiment will be explained in detail below.

As shown in FIG. 3, the tunnel layer 70 includes an air gap layer 57 and the third sacrificial layer 55.

The air gap layer 57 is formed on the charge storage layer 54 in the U-shaped memory hole 51 formed in the selection gate SG, control gates CG, insulating layer 45, and inter-electrode insulating layers 53a. The air gap layer 57 is also formed on the charge storage layer 54 in a part of the upper portion of the U-shaped memory hole 51 formed in the dummy control gate DCG. By thus forming the air gap layer 57 as the tunnel layer 70 in the memory cell transistor MTr, leakage from the charge storage layer 54 can be suppressed.

Note that the air gap layer 57 need not be formed on the charge storage layer 54 in the U-shaped memory hole 51 formed in the selection gate SG and insulating layer 45, and the insulating layer 59 may also be buried in this portion.

The third sacrificial layer 55 is formed on the charge storage layer 54 in the U-shaped memory hole 51 formed in the back-gate BG. The third sacrificial layer 55 is also formed on the charge storage layer 54 in the U-shaped memory hole 51 formed in the insulating layer 41, and on the charge storage layer 54 in a part of the lower portion of the U-shaped memory hole 51 formed in the dummy control gate DCG.

That is, in the tunnel layer 70 in the U-shaped memory hole 51, the third sacrificial layer 55 is formed in the lower portion, and the air gap layer 57 is formed in the upper portion. The third sacrificial layer 55 is continuously formed from the charge storage layer 54 in the connecting hole 60b onto the charge storage layer 54 in parts of the lower portions of the pair of through-holes 49. More specifically, the third sacrificial layer 55 is continuously formed from the charge storage layer 54 in the connecting hole 60b onto the charge storage layer 54 in parts of the lower portions of the pair of through-holes 49 formed in the dummy control gate DCG. In other words, the boundary between the third sacrificial layer 55 and air gap layer 57 is positioned in the U-shaped memory hole 51 formed in the dummy control gate DCG.

The third sacrificial layer 55 is formed in contact with the U-shaped silicon pillar SP positioned inside the U-shaped memory hole 51. This enables the third sacrificial layer 55 to support the U-shaped silicon pillar SP and core layer 56 in a hollow state.

The third sacrificial layer 55 is a metal layer of an N-based (nitride-based) compound or C-based (carbide-based) compound. Examples of the metal layer are TiN as the N-based compound, and TaC as the C-based compound. Note that the third sacrificial layer 55 is not limited to the metal layer, and may also be a conductive layer having etching selectivity to silicon, silicon oxide, and silicon nitride in manufacturing steps to be described later. The third sacrificial layer 55 is formed in contact with the U-shaped silicon pillar SP in the U-shaped memory hole 51 (connecting hole 60b) formed in the back-gate BG, and electrically connected to the channels of dummy memory cell transistors DMTr0 and DMTr1. That is, the channels of dummy memory cell transistors DMTr0 and DMTr1 can always electrically be connected by using the back-gate BG as the interconnection 80, without causing the back-gate BG to function as a transistor.

Note that the boundary between the third sacrificial layer 55 and air gap layer 57 is not limited to the U-shaped memory hole 51 formed in the dummy control gate DCG. The formation region of the third sacrificial layer 55 is determined by taking account of conduction to the channels of dummy memory cell transistors DMTr0 and DMTr1 by the third sacrificial layer 55, the support of the U-shaped silicon pillar SP by the third sacrificial layer 55, and the electrical influence of the third sacrificial layer 55 on memory cell transistors MTr2 and MTr3.

More specifically, the third sacrificial layer 55 is continuously formed in at least the connecting hole 60b in order to electrically connect the channels of dummy memory cell transistors DMTr0 and DMTr1. Also, the third sacrificial layer 55 is desirably formed up to relatively upper layer portions in order to support the U-shaped silicon pillar SP. However, if the third sacrificial layer 55 is formed up to the upper layer portions, the third sacrificial layer 55 affects memory cell transistors MTr2 and MTr3 and produces control variations. Therefore, the third sacrificial layer 55 is formed within the pair of through-holes 49 formed in the dummy control gate DCG. By taking these conditions into consideration, the upper surface of the third sacrificial layer 55 is made equal to or higher than the upper surface of the back-gate BG, and made equal to or lower than the upper surface of the dummy control gate DCG.

Since the dummy control gate DCG (dummy memory cell transistor DMTr) is a cell that does not store data, it is unnecessary to take account of the electrical influence of the third sacrificial layer 55 on the dummy memory cell transistor DMTr. That is, the film thickness of the dummy control gate DCG can be used as the margin of the formation region of the third sacrificial layer 55.

[Manufacturing Method]

Next, a method of manufacturing the semiconductor memory device according to this embodiment will be explained with reference to FIGS. 5, 6, 7, 8, 9, 10, 11, 12, 13, and 14.

FIGS. 5, 6, 7, 8, 9, 10, 11, 12, 13, and 14 are sectional views showing manufacturing steps of the semiconductor memory device (NAND string 40) according to this embodiment.

First, as shown in FIG. 5, an insulating layer 31 of, for example, silicon oxide is formed on a semiconductor substrate 30. A back-gate BG is formed on the insulating layer 31. The back-gate BG can be formed by a polysilicon (doped silicon) layer in which an impurity (for example, phosphorus) is doped, and can also be formed by an insulating layer of, for example, silicon oxide, silicon nitride, or a high-k material.

A trench 60a is formed in the back-gate BG by photolithography and etching. The trench 60a extends in the column direction, and functions as a connecting hole 60b to be described in a later step. Also, a plurality of trenches 60a are arranged in a matrix in a plane in the row and column directions.

Then, an undoped silicon layer in which no impurity is doped is formed on the entire surface. After that, the undoped silicon layer is removed by etching from the upper surface of the back-gate BG outside the trench 60a, and left behind in only the trench 60a, thereby forming a first sacrificial layer 60 consisting of the undoped silicon layer and filling the trench 60a.

Figure 6:
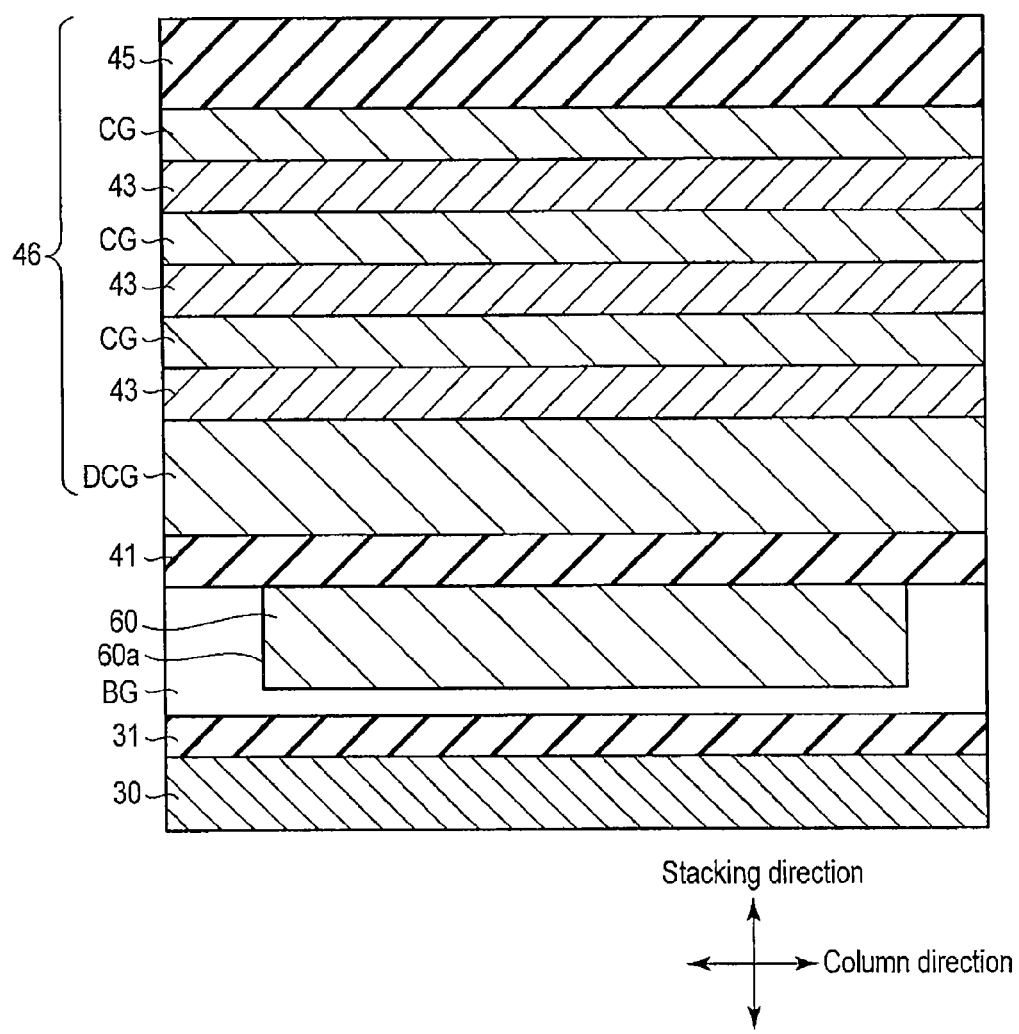

Subsequently, as shown in FIG. 6, an insulating layer 41 of, for example, silicon oxide is formed on the back-gate BG in which the dummy layer 60 is formed. A dummy control gate DCG is formed on the insulating layer 41. Second sacrificial layers 43 and control gates CG are alternately stacked on the dummy control gate DCG. The dummy control gate DCG and control gates CG each consist of a doped silicon (p-type polysilicon) layer in which an impurity (for example, boron) is doped. The second sacrificial layers 43 are undoped silicon layers in which no impurity is doped. The second sacrificial layers 43 are replaced with inter-electrode insulating layers 53a in a later step.

The dummy control gate DCG is formed to have a film thickness larger than that of the control gate CG. This makes it possible to increase the margin of the formation region of a third sacrificial layer 55 in a later step.

Note that FIG. 6 shows an example in which three control gates CG and three second sacrificial layers 43 are stacked, but the number of layers to be stacked is not limited to three.

After that, an insulating layer 45 of, for example, silicon oxide is formed on the uppermost control gate CG.

Thus, a stack 46 including the dummy control gate DCG, control gates CG, second sacrificial layers 43, and insulating layer 45 is formed.

Figure 7:
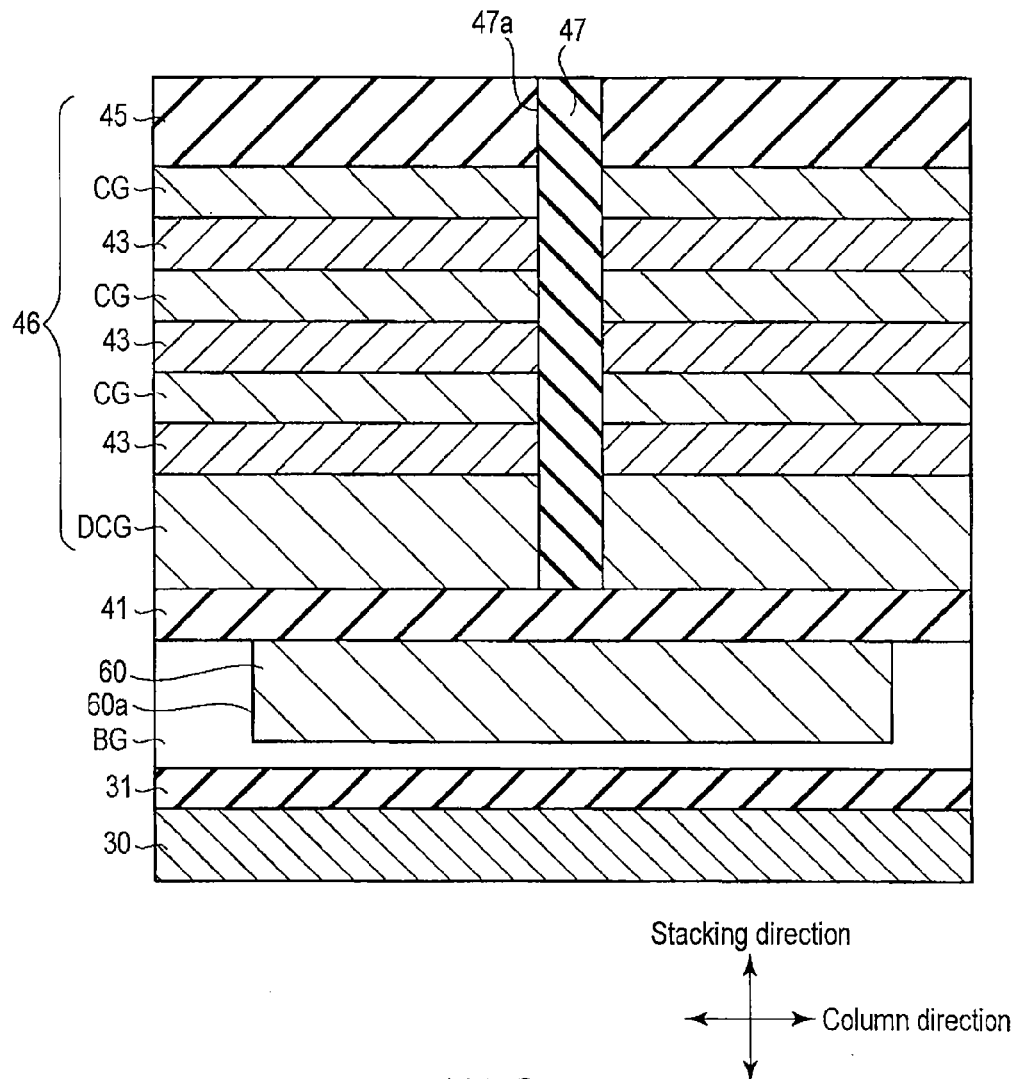

As shown in FIG. 7, a slit 47a is formed in the stack 46 by photolithography and etching. The slit 47a is formed to extend through the stack 46 along the row direction (backward on the drawing surface of FIG. 7). That is, the slit 47a is formed to spread in the row direction and stacking direction, thereby dividing the stack 46. Also, the slit 47a is formed to be positioned above the central portion of the first sacrificial layer 60 in the column direction. Furthermore, the insulating layer 41 is exposed to the bottom surface of the slit 47a.

Then, a sacrificial material 47 of silicon nitride is buried in the slit 47a. More specifically, after the sacrificial material 47 is formed on the entire surface until the slit 47a is filled, the sacrificial material 47 is removed from the surface of the insulating layer 45. Consequently, the sacrificial material 47 remains in the slit 47a, i.e., the sacrificial material 47 spreading in the row direction and stacking direction is formed.

Figure 8:
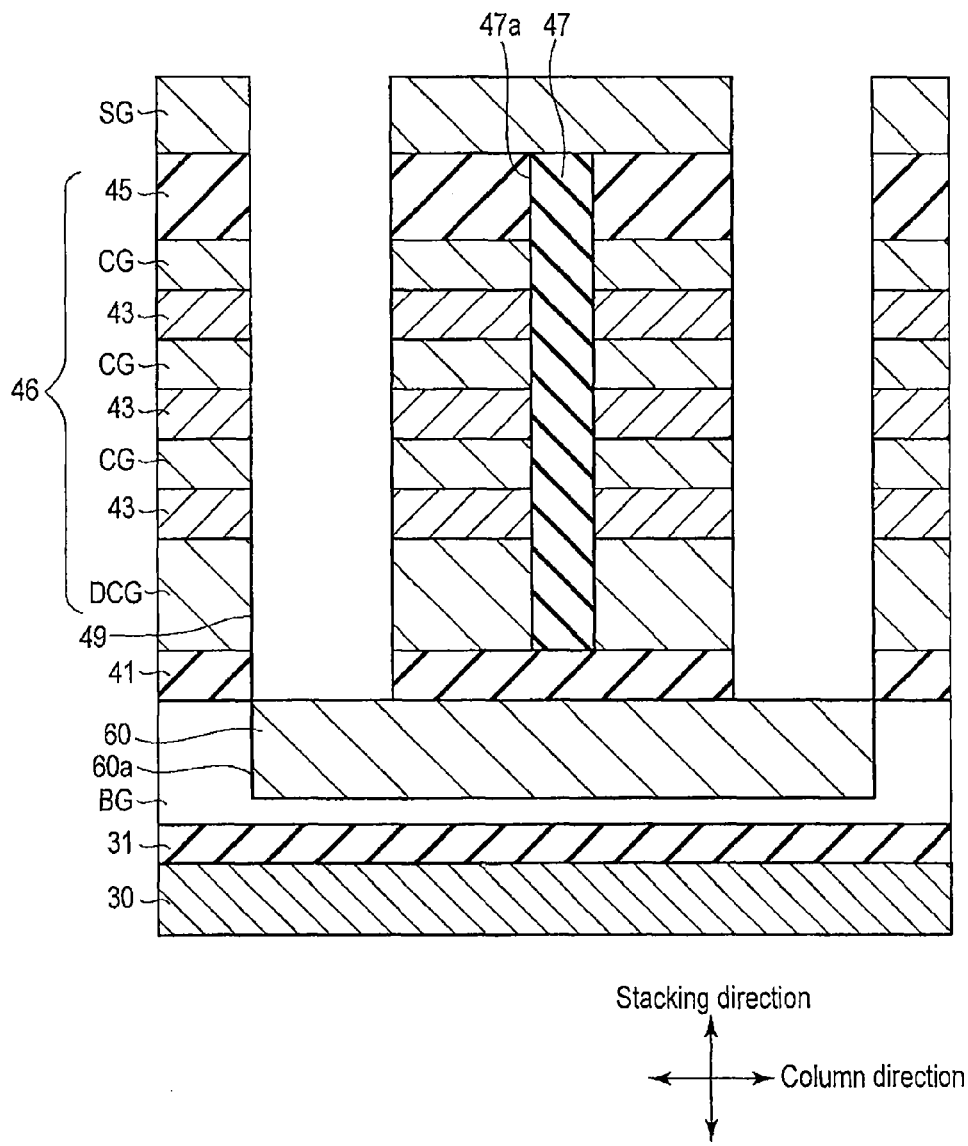

As shown in FIG. 8, a selection gate SG (a drain-side selection gate SGD and source-side selection gate SGS) is formed on the insulating layer 45. The selection gate SG consists of a doped silicon (p-type polysilicon) layer in which an impurity (for example, boron) is doped.

After that, a pair of through-holes 49 are formed in the selection gate SG, stack 46, and insulating layer 41. The pair of through-holes 49 are so formed as to reach the two end portions of the first sacrificial layer 60 in the column direction. This exposes the selection gate SG, stack 46, insulating layer 41, and first sacrificial layer 60 through the through-holes 49.

Each through-hole 49 is formed to have, for example, a circular shape when viewed in the stacking direction. Also, the pair of through-holes 49 are juxtaposed in the column direction, and extend in the stacking direction in the selection gate SG, stack 46, and insulating layer 41.

As shown in FIG. 9, wet etching is performed through the through-holes 49. This wet etching is performed using, for example, an alkaline etching solution. The wet etching removes the second sacrificial layers 43 of the stack 46. Consequently, gaps 52 are formed between two control gates CG adjacent to each other in the stacking direction and between the control gate CG and dummy control gate DCG, and the sacrificial material 47 is exposed through the gaps 52.

At the same time, the first sacrificial layer 60 is removed. Consequently, a connecting hole 60b (trench 60a) extending in the column direction and connecting the lower ends of the pair of through-holes 49 is formed in the back-gate BG. That is, a U-shaped memory hole 51 including the pair of through-holes 49 and connecting hole 60b is formed in the selection gate SG, stack 46, insulating layer 41, and back-gate BG.

In this step, it is possible, by properly selecting an etching solution, to achieve a high etching selectivity between a group of the selection gate SG, control gates CG, dummy control gate DCG, and back-gate BG formed by the doped silicon layers, and a group of the first sacrificial layer 60 and second sacrificial layers 43 formed by the undoped silicon layers. Accordingly, the selection gate SG, control gates CG, dummy control gate DCG, and back-gate BG formed by the doped silicon layers are almost not etched but remain. Note that even when the back-gate BG is formed by an insulating layer or the like, the back-gate BG is almost not etched but remains. The control gates CG are supported by the sacrificial material 47.

Figure 10:
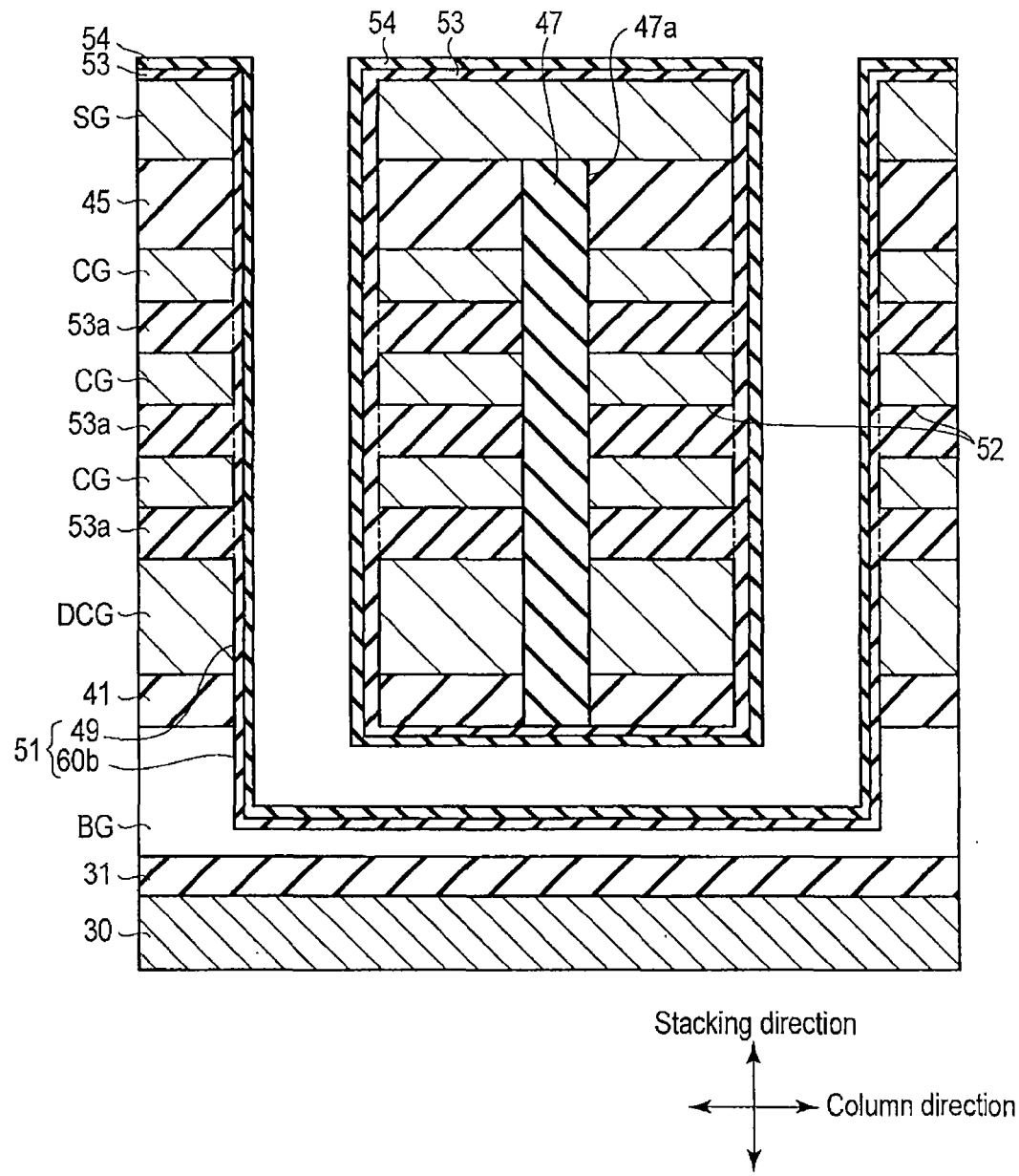

Then, as shown in FIG. 10, a block insulating layer 53 is formed on the inner surfaces of the U-shaped memory hole 51 by, for example, atomic layer deposition (ALD) or chemical vapor deposition (CVD). That is, the block insulating layer 53 is formed on the selection gate SG, control gates CG, dummy control gate DCG, back-gate BG, and insulating layers 41 and 45 exposed in the U-shaped memory hole 51. The block insulating layer 53 is an insulating layer of, for example, silicon oxide or silicon nitride, or have a multilayered structure including layers of these materials.

In this step, the block insulating layer 53 is also formed on the inner surfaces of the gaps 52 through the through-holes 49. That is, the block insulating layer 53 is also formed on the control gates CG, dummy control gate DCG, and sacrificial material 47 exposed in the gaps 52. Consequently, inter-electrode insulating layers 53a integrated with the block insulating layer 53 are buried in the gaps 52. In addition, the block insulating layer 53 is formed on (the upper surface of) the selection gate SG outside the U-shaped memory hole 51.

Then, a charge storage layer 54 is formed on the block insulating layer 53 in the U-shaped memory hole 51 by, for example, ALD or CVD. The charge storage layer 54 is also formed on the block insulating layer 53 outside the U-shaped memory hole 51. The charge storage layer 54 is an insulating layer of, for example, silicon nitride.

Figure 11:
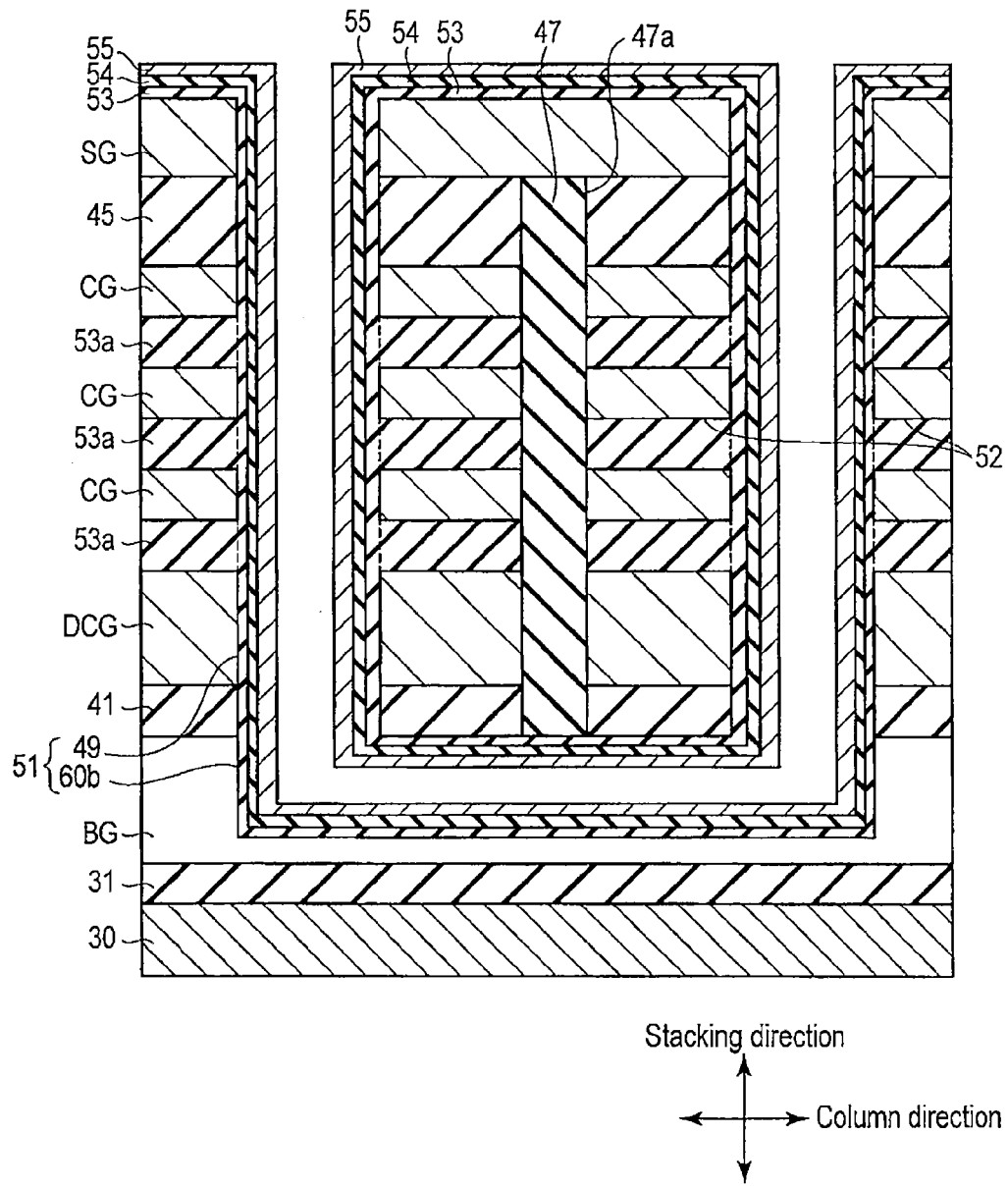

As shown in FIG. 11, a third sacrificial layer 55 is formed on the charge storage layer 54 in the U-shaped memory hole 51 by, for example, ALD or CVD. The third sacrificial layer 55 is also formed on the charge storage layer 54 outside the U-shaped memory hole 51. The third sacrificial layer 55 is a metal layer of an N-based (nitride-based) compound or C-based (carbide-based) compound. Examples of the metal layer are TiN as the N-based compound, and TaC as the C-based compound. The third sacrificial layer 55 is not limited to the metal layer, and may also be a conductive layer having etching selectivity to silicon, silicon oxide, and silicon nitride in manufacturing steps to be described later. The formation region of the third sacrificial layer 55 in the U-shaped memory hole 51 is a region that functions as a tunnel layer 70 later.

Figure 12:
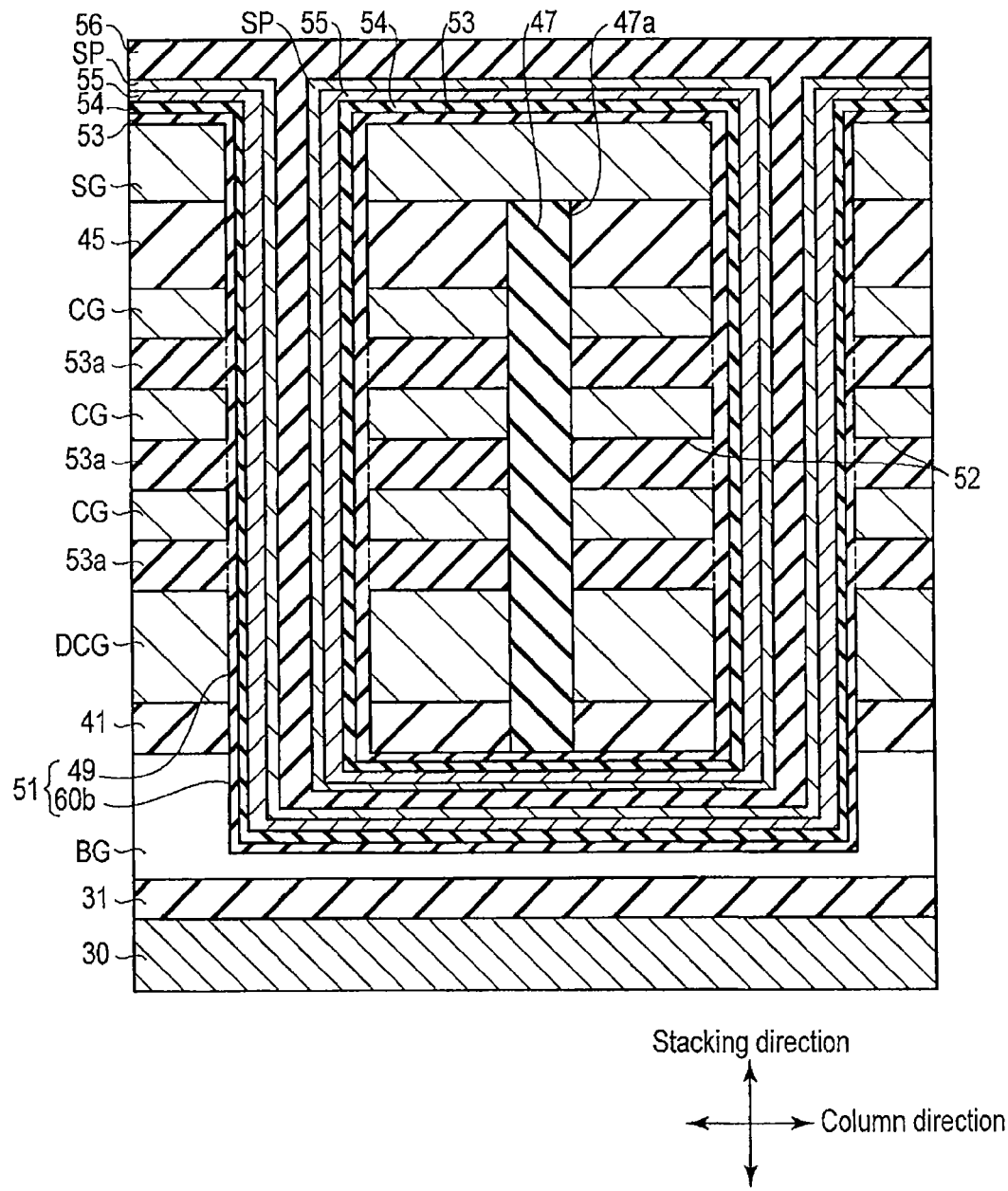

As shown in FIG. 12, a U-shaped silicon pillar SP is formed on the third sacrificial layer 55 in the U-shaped memory hole 51. The U-shaped silicon pillar SP is also formed on the third sacrificial layer 55 outside the U-shaped memory hole 51. The U-shaped silicon pillar SP is formed by a conductive layer of, for example, polysilicon containing an impurity (for example, phosphorus).

After that, a core layer 56 is formed on the U-shaped silicon pillar SP in the U-shaped memory hole 51 by, for example, ALD or CVD. The core layer 56 is also formed on the U-shaped silicon pillar SP outside the U-shaped memory hole 51. The core layer 56 is an insulating layer of, for example, silicon oxide, and fills the U-shaped memory hole 51. Note that it is also possible to make the core layer 56 hollow, and leave the U-shaped memory hole 51 unfilled.

Then, as shown in FIG. 13, the core layer 56 and U-shaped silicon pillar SP formed outside the U-shaped memory hole 51 are removed by dry etching such as RIE (Reactive Ion Etching), thereby exposing the third sacrificial layer 55.

Subsequently, as shown in FIG. 14, the upper portion of the exposed third sacrificial layer 55 is removed by wet etching or the like. In this step, wet etching having etching selectivity between the third sacrificial layer 55 and the core layer 56, U-shaped silicon pillar SP, and charge storage layer 54 is performed. For example, when the third sacrificial layer 55 is of TiN, a solution mixture of a hydrogen peroxide solution and sulfuric acid solution is used to obtain etching selectivity to silicon, silicon oxide, and silicon nitride forming the core layer 56, U-shaped silicon pillar SP, and charge storage layer 54. Consequently, only the third sacrificial layer 55 can be removed.

In this step, the upper surface of the third sacrificial layer 55 is made equal to or higher than the upper surface of the back-gate BG, and equal to or lower than the upper surface of the dummy control gate DCG. That is, after the upper surface of the third sacrificial layer 55 is leveled with that of the dummy control gate DCG, wet etching is stopped until the upper surface of the third sacrificial layer 55 is leveled with that of the back-gate BG. Therefore, the etching margin of the third sacrificial layer 55 can be increased by increasing the film thickness of the dummy control gate DCG.

Thus, a tunnel layer 70 including the third sacrificial layer 55 formed in the lower portion and an air gap layer 57 formed in the upper portion is formed in the U-shaped memory hole 51. More specifically, the air gap layer 57 is formed on the charge storage layer 54 in the U-shaped memory hole 51 formed in the selection gate SG, control gates CG, insulating layers 41 and 45, and inter-electrode insulating layers 53a, and on the charge storage layer 54 in a part of the upper portion of the U-shaped memory hole 51 formed in the dummy control gate DCG. The third sacrificial layer 55 is formed on the charge storage layer 54 in the U-shaped memory hole 51 formed in the back-gate BG, and on the charge storage layer 54 in a part of the lower portion in the U-shaped memory hole 51 formed in the dummy control gate DCG.

Furthermore, the third sacrificial layer 55 is formed to remain to such an extent as to support the U-shaped silicon pillar SP and core layer 56 in the hollow state.

Then, as shown in FIG. 3, the charge storage layer 54 and block insulating layer 53 formed outside the U-shaped memory hole 51 are removed, and the upper surface is planarized.

After that, an insulating layer 59 of, for example, silicon oxide is formed on the selection gate SG by a low-coverage deposition method such as P (Plasma)-CVD. Since the coverage is low, the insulating layer 59 is not formed in the air gap layer 57.

A portion of the insulating layer 59 (the upper portion of the sacrificial material 47) is opened in the row direction by, for example, RIE, thereby exposing the selection gate SG. In addition, an opening 47b is formed through the selection gate SG by, for example, RIE, thereby exposing the sacrificial material 47.

Subsequently, wet etching is performed through the opening 47b, thereby removing the sacrificial material 47 from the slit 47a. Consequently, the control gates CG are exposed in the slit 47a. After that, the exposed control gates CG are silicidized.

Finally, an insulating material 58 of, for example, silicon oxide is buried in the slit 47a and opening 47b, and also buried in the opening of the insulating layer 59.

Thus, the NAND string 40 according to this embodiment is formed.

[Effects]

In the U-shaped Three-dimensionally stacked memory according to the above-mentioned embodiment, the air gap layer 57 is formed as the tunnel layer 70 in the U-shaped memory hole 51 formed in the control gates CG. This makes it possible to suppress leakage from the charge storage layer 54 and improve the charge retention characteristic in the memory cell transistor MTr. In this structure, the third sacrificial layer 55 is filled as the tunnel layer 70 in the lower portion of the U-shaped memory hole 51 (in the back-gate BG). In the U-shaped memory hole 51, therefore, the U-shaped silicon pillar SP and core layer 56 formed inside the tunnel layer 70 can be supported by the third sacrificial layer 55.

Also, in this embodiment, the lowermost layer of the plurality of stacked control gates CG is the dummy control gate DCG. Therefore, it is possible to suppress the variations in cell characteristics of the plurality of control gates CG except for the dummy control gate DCG. The margin of the formation region of the third sacrificial layer 55 can be increased by forming the third sacrificial layer 55 in the U-shaped silicon pillar 51 from inner the back-gate BG to inner the dummy control gate DCG. Accordingly, it is possible to increase the size of the portion where the U-shaped silicon pillar SP and core layer 56 are supported by the third sacrificial layer 55, thereby increasing the supporting force.

Furthermore, the third sacrificial layer 55 is formed by a metal layer in this embodiment. This metal layer is formed in the back-gate BG, and formed in contact with the U-shaped silicon pillar SP. Consequently, the interconnection 80 that is always in a conductive state is formed in the U-shaped memory hole 51 (the connecting hole 60b) in the back-gate BG. This obviates the need for controlling back-gate BG and a control circuit for the control. Consequently, operation control and the circuit layout can be relaxed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A semiconductor memory device comprising:
a semiconductor substrate;
a first layer formed on the semiconductor substrate and having a connecting hole;
a first conductive layer, an inter-electrode insulating layer, and a second conductive layer sequentially stacked above the first layer, and having a pair of through-holes extending in a stacking direction, lower ends of the pair of through-holes connecting to both ends of the connecting hole respectively;
a block insulating layer formed on inner surfaces of the pair of through-holes, and on an inner surface of the connecting hole;
a charge storage layer formed on the block insulating layer;
a second layer formed on the charge storage layer; and
a semiconductor layer formed on the second layer,
wherein the second layer includes an air gap layer in the pair of through-holes, and a third conductive layer in the connecting hole.

2. The device of claim 1, wherein the third conductive layer is continuously formed from the connecting hole to portions of the pair of through-holes.

3. The device of claim 1, wherein the first conductive layer is a dummy control gate, and the third conductive layer is continuously formed from the connecting hole to portions of the pair of through-holes surrounded by the first conductive layer.

4. The device of claim 3, wherein a film thickness of the first conductive layer is larger than that of the second conductive layer.

5. The device of claim 3, wherein the first conductive layer and the second conductive layer comprises doped silicon in which an impurity is doped.

6. The device of claim 1, wherein the third conductive layer comprises a metal layer including one of a nitride compound and a carbide compound.

7. The device of claim 1, wherein the third conductive layer comprises one of TiN and TaC.

8. The device of claim 1, wherein the first layer comprises an insulating layer.

9. The device of claim 8, wherein the insulating layer includes one of silicon oxide, silicon nitride, and a high-k material.

10. The device of claim 1, wherein the third conductive layer is formed in contact with the semiconductor layer.

11. A semiconductor memory device comprising:
a semiconductor substrate;
a first layer formed on the semiconductor substrate and having a connecting hole;
a first conductive layer, an inter-electrode insulating layer, and a second conductive layer sequentially stacked above the first layer, and having a pair of through-holes extending in a stacking direction, lower ends of the pair of through-holes connecting to both ends of the connecting hole respectively;
a block insulating layer formed on inner surfaces of the pair of through-holes, and on an inner surface of the connecting hole;
a charge storage layer formed on the block insulating layer;
a second layer formed on the charge storage layer; and
a semiconductor layer formed on the second layer,
wherein the second layer includes an air gap layer in the pair of through-holes.

12. The device of claim 11, wherein the second layer also includes a sacrificial layer being continuously formed from the connecting hole to portions of the pair of through-holes.

13. The device of claim 11, wherein the first conductive layer is a dummy control gate, and the second layer also includes a sacrificial layer being continuously formed from the connecting hole to portions of the pair of through-holes surrounded by the first conductive layer.

14. The device of claim 13, wherein a film thickness of the first conductive layer is larger than that of the second conductive layer.

15. The device of claim 13, wherein the first conductive layer and the second conductive layer comprises doped silicon in which an impurity is doped.

16. A semiconductor memory device manufacturing method comprising:
forming a first layer on a semiconductor substrate;
sequentially forming a first conductive layer, an inter-electrode insulating layer, and a second conductive layer above the first layer, and thereby forming a lamination stack;
forming a pair of through-holes extending in a stacking direction in the first conductive layer, the inter-electrode insulating layer, and the second conductive layer, and forming a connecting hole connecting lower ends of the pair of through-holes in the first layer;
forming a block insulating layer on inner surfaces of the pair of through-holes and the connecting hole, and on a surface of the lamination stack;
forming a charge storage layer on the block insulating layer;
forming a third conductive layer on the charge storage layer;
forming a semiconductor layer on the third conductive layer;
exposing the third conductive layer by removing the semiconductor layer formed above the lamination stack; and
removing an upper portion of the third conductive layer, thereby forming a second layer including the third conductive layer in the connecting hole, and an air gap layer in the pair of through-holes.

17. The method of claim 16, wherein the third conductive layer comprises a material having etching selectivity to the charge storage layer.

18. The method of claim 16, wherein the removing the third conductive layer is performed by wet etching.

19. The method of claim 16, further comprising:
removing the charge storage layer and the block insulating layer formed above the lamination stack; and
forming an insulating layer on a surface of the lamination stack by P-CVD.

20. The method of claim 16, wherein the removing the third conductive layer makes an upper surface of the third conductive layer equal to or higher than an upper surface of the first layer, and equal to or lower than an upper surface of the first conductive layer.

* * * * *